US009879978B2

(12) United States Patent
Pareschi

(10) Patent No.: US 9,879,978 B2
(45) Date of Patent: Jan. 30, 2018

(54) METHOD AND APPARATUS FOR OPTICALLY CHECKING BY INTERFEROMETRY THE THICKNESS OF AN OBJECT BEING MACHINED

(71) Applicant: MARPOSS SOCIETA' PER AZIONI, Bentivoglio Bo (IT)

(72) Inventor: Stefano Pareschi, San Pietro In Casale (IT)

(73) Assignee: MARPOSS SOCIETA' PER AZIONI, Bentivoglio Bo (IT)

( * ) Notice: Subject to any disclaimer, the term of this patent is extended or adjusted under 35 U.S.C. 154(b) by 0 days.

(21) Appl. No.: 14/905,541

(22) PCT Filed: Jul. 24, 2014

(86) PCT No.: PCT/EP2014/065963
§ 371 (c)(1),
(2) Date: Jan. 15, 2016

(87) PCT Pub. No.: WO2015/011243
PCT Pub. Date: Jan. 29, 2015

(65) Prior Publication Data
US 2016/0153769 A1 Jun. 2, 2016

(30) Foreign Application Priority Data
Jul. 26, 2013 (IT) .............................. BO2013A0403

(51) Int. Cl.
*G01B 11/06* (2006.01)
*G01B 9/02* (2006.01)
(Continued)

(52) U.S. Cl.
CPC ............ *G01B 11/06* (2013.01); *B24B 37/013* (2013.01); *B24B 49/12* (2013.01); *G01B 9/0209* (2013.01);
(Continued)

(58) Field of Classification Search
CPC . G01B 11/06; G01B 11/0633; G01B 11/0675; G01B 9/02044; G01J 3/45
(Continued)

(56) References Cited
U.S. PATENT DOCUMENTS 6,319,093 B1 * 11/2001 Lebel .................... B24B 37/013
451/41
2006/0044567 A1 * 3/2006 Ueki .................. G01B 11/2441
356/497
(Continued)

FOREIGN PATENT DOCUMENTS

DE    10 2011 051 146 B3    10/2012
EP    1 258 916 A1    11/2002
(Continued)

OTHER PUBLICATIONS

P.E. Schmid, "Optical Absorption in Heavily Doped Silicon", Physical Review B, vol. 23, No. 10, May 15, 1981, pp. 5531-5536.

*Primary Examiner* — Jonathan Hansen
(74) *Attorney, Agent, or Firm* — Blank Rome LLP; Mark J. Thronson; Tara L. Marcus

(57) ABSTRACT

A method for optically checking by interferometry the thickness of an object (2) being machined comprises a phase of direct checking wherein the spectrum of the result of interference between primary reflected radiations (R1) generated by reflection of incident radiations (I) on an external surface (16) and secondary reflected radiations (R2) generated by reflection on an internal surface of discontinuity (17) of the object is analyzed, and a preliminary phase wherein information relative to the variation of a virtual thickness (D) delimited and defined by a reference surface (18) and the external surface of the object, indicative of thickness variations of the object being machined. In the preliminary phase, the processing is based on the analysis of the spectrum of the result of interference between primary reflected radiations (Continued)

and reference reflected radiations (Rref) generated by the reflection of the incident radiations on the reference surface, that defines the length of a reference optical path. An apparatus that implements such method for optically checking includes an optical probe (6) that receives and detects the primary, secondary and reference reflected radiations, and a spectrometer (5) that analyzes the spectrum of the result of interference.

15 Claims, 6 Drawing Sheets

(51) Int. Cl.
    *B24B 49/12*     (2006.01)
    *B24B 37/013*     (2012.01)
    *H01L 21/66*     (2006.01)

(52) U.S. Cl.
    CPC ..... *G01B 9/02021* (2013.01); *G01B 9/02025* (2013.01); *G01B 9/02044* (2013.01); *G01B 11/0675* (2013.01); *H01L 22/12* (2013.01); *H01L 22/26* (2013.01)

(58) Field of Classification Search
    USPC .......................................................... 356/503
    See application file for complete search history.

(56) References Cited

U.S. PATENT DOCUMENTS

| | | | |
|---|---|---|---|
| 2011/0222071 A1 | 9/2011 | Grotkopp et al. | |
| 2012/0257207 A1* | 10/2012 | Marx | G01B 9/02004 356/451 |
| 2012/0320380 A1* | 12/2012 | Schonleber | G01B 11/0625 356/479 |

FOREIGN PATENT DOCUMENTS

| | | |
|---|---|---|
| EP | 2 144 034 A1 | 1/2010 |
| WO | WO 2009/013231 A1 | 1/2009 |

\* cited by examiner

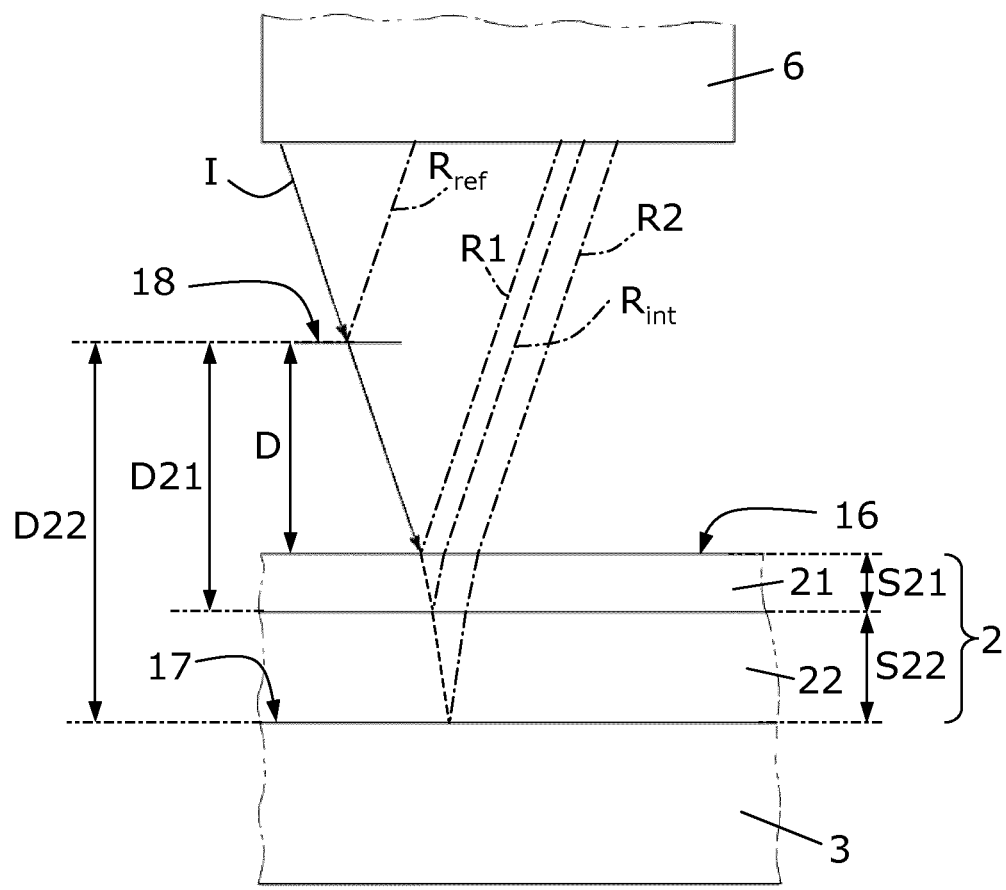
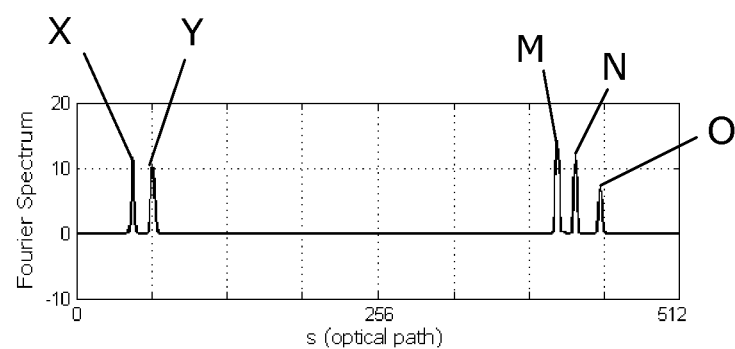
Fig. 8a
Fig. 8b

METHOD AND APPARATUS FOR OPTICALLY CHECKING BY INTERFEROMETRY THE THICKNESS OF AN OBJECT BEING MACHINED

TECHNICAL FIELD

The present invention relates to a method and an apparatus for optically checking by interferometry the thickness of an object being machined.

The present invention can advantageously, but not exclusively, be applied in checking by interferometry the thickness of objects being machined having structural features, for instance the entity of the thickness itself, and/or a particular chemical composition, such that high absorption of the light radiations is implied, for example slices or wafers of highly doped semiconductor material (typically silicon, including a region with a high concentration of a different chemical element, or "dopant", such as phosphorus), which will be explicitly referred to in the following specification without loss of generality.

PRIOR ART

Semiconductor materials are broadly used to realize integrated circuits or electronic devices. For example, a slice of semiconductor material can be machined to obtain Micro-Electro-Mechanical Systems or MEMS. With the aim of increasing the conductivity in predetermined regions of the semiconductor material, a technique named "doping" is used, which consists in increasing the number of free electric charges within such predetermined regions by introducing a chemical element, such as phosphorus, which takes the name of "dopant". In order that the semiconductor material takes electrical properties very similar to those of a metal, the amount of dopant must be very high at the predetermined doped regions, such that the electrical conductivity is of the order of 1000 $(\Omega \cdot cm)^{-1}$. In this case one speaks of degenerate or highly doped semiconductor material.

As a rule, it is necessary that the slice of semiconductor material, whether or not highly doped, is mechanically machined by grinding and polishing to achieve a uniform thickness equal to a desired value; in this phase, it is necessary to check the thickness of the slice while it is machined, in order to ensure getting exactly the desired value.

The known techniques for checking the thickness of a slice of semiconductor material exploit different technologies and are mainly of two types. A first known technique is of contact type and implies the use of one or more gauging heads with mechanical feelers that touch an outer surface of the slice being machined and detects variations of its height with respect to a reference surface, for example. This technique, however, can damage the slice of semiconductor material during the check because of the contact with the mechanical feelers, and does not allow the checking of very thin thicknesses, for instance less then 100 μm.

Other known techniques for checking the thickness of a slice of semiconductor material, of contactless type, imply the use of capacitive, inductive (eddy current or other), or ultrasound probes. These techniques do not damage the slice of semiconductor material during the check, but show limitations both in the checkable dimensions range and in the maximum achievable resolution.

One must also consider that, particularly when the slice of semiconductor material is very thin, it is attached on a support layer (generally plastic or glass) which has the function of providing a greater mechanical strength and therefore increasing handling. The known techniques, both contact and contactless type, which check variations of height of the machined outer surface with respect to a reference surface, are able to give information about the total thickness of the object (semiconductor material and support layer) but do not allow the thickness of the slice of semiconductor material to be checked with sufficient accuracy, because the thickness of the support layer is not known in a sufficiently accurate manner.

In order to overcome the limitations of said known techniques, optical probes and interferometry techniques are used. For example, the European patent application published under number EP2174092A1 describes a method and an apparatus for optically checking the thickness of a slice of semiconductor material, for instance silicon, having one or more layers. Such apparatus comprises an optical probe facing the silicon slice being machined and connected to an optical coupler. To the same optical coupler are further connected a light source that emits a beam of low coherence light within a range of wavelengths in the near infrared region (since silicon is sufficiently transparent to infrared radiations), and a spectrometer to analyse the spectrum of the result of interference between radiations reflected by the outer surface and by the surfaces of optical discontinuity inside the object being machined, in particular from the surface which separates the silicon slice from the support layer, and more generally, when the slice comprises several layers, also from other surfaces of discontinuity.

The thickness of the optically homogeneous layer or layers gone through by said radiations can be determined from such analysis. The regions of the silicon layers wherein the conductivity is increased as a consequence of the high doping become less transparent to the light radiations in general, and to the infrared radiations in particular. In fact, the free electric charges due to the doping, on the one hand increase the conductivity of the material itself, on the other reduce its transparency to light radiations through mechanisms of absorption and reflection (the increase in the number of free electrons increases in particular the phenomenon of reflection). This phenomenon is well-known and it is described, for example, in the paper entitled "Optical absorption in heavily doped silicon", by P. E. Schmid (Physical Review B, Volume 23, Number 10, May 15, 1981). Therefore, the known technique based on checking by interferometry is limited by this reduction of transparency and does not allow to check thicknesses of slices of highly doped silicon greater than a certain value, which varies with the doping level (for example, 100 μm in case of a doping such that the electrical conductivity shows the order of 1000 $(\Omega \cdot cm)^{-1}$). The machining of objects of this type therefore cannot be suitably checked in real time, particularly in the initial phase, that is when the entity of the thickness is likely to be much greater than the desired final value. The inability in verifying the progress of machining and accordingly adjusting its speed, at least until a moment not known a priori, when the thickness is very close to the desired final one, does not guarantee a sufficiently reliable and accurate check: the risk is such that, if the speed of the tool is relatively high at the moment when the check becomes possible, the machining is not correctly stopped on reaching the value of desired thickness.

DISCLOSURE OF THE INVENTION

Object of the present invention is to realize a method and an apparatus for optically checking by interferometry the thickness of an object being machined, such method and such system being free from the previously described inconveniences and, concurrently, easily and cheaply implemented.

According to the present invention, this and other objects are achieved by a method and an apparatus according to claim 1 and claim 11, respectively.

Objects and advantages of the present invention will be clear from the detailed description that follows, concerning a preferred embodiment of the invention, given only by way of non-restrictive example, with reference to the attached drawings.

BRIEF DESCRIPTION OF THE DRAWINGS

The present invention is now described with reference to the attached sheets of drawings, given by way of non-limiting examples, wherein:

FIGS. 8a and 8b are, respectively, an enlarged schematic and lateral sectional view of a slice with two layers of semiconductor material, and the Fourier transform as a function of the optical path length of the spectrum of the result of interference between the radiations reflected by the surfaces of discontinuity of said slice, which conceptually illustrate a given instant of the check according to a particular embodiment of the invention, such instant following the given instant of FIGS. 7a and 7b.

BEST MODE FOR CARRYING OUT THE INVENTION

Figure 1:
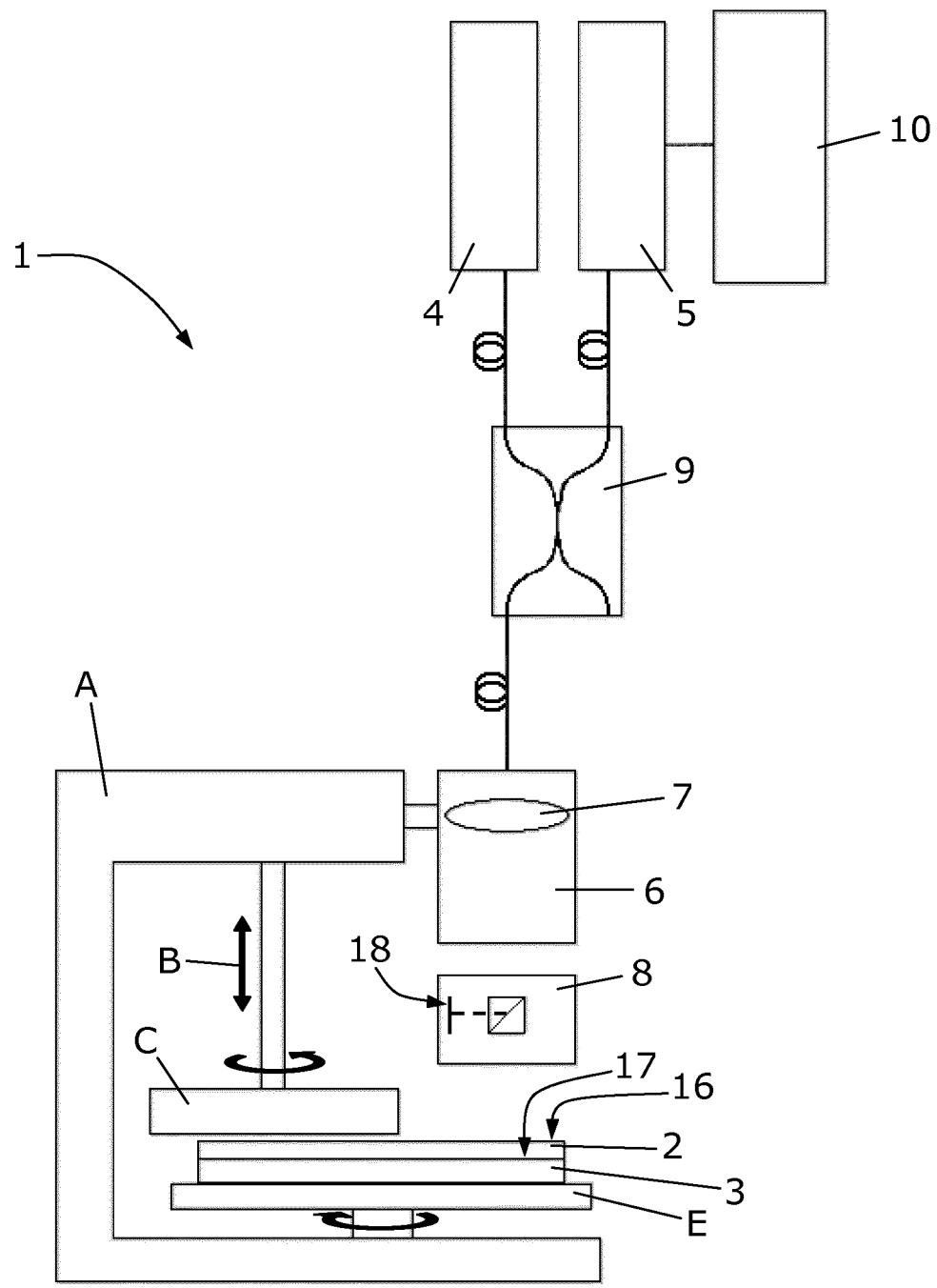
FIG. 1 is a schematic view, with parts removed for clarity, of an apparatus for optically checking by interferometry the thickness of a slice of semiconductor material.

In FIG. 1, number 1 refers to an apparatus as a whole for optically checking by interferometry the thickness of an object 2, constituted by a slice of semiconductor material, for example silicon, highly doped, being machined on a machine tool which comprises a frame A and at least a movable tool C, for example a grinding wheel adapted to rotate in a direction of rotation and move by means of a movement system, in particular advance towards the object along a direction of machining B. The thickness to be checked extends from an external surface 16 of the slice 2, which the tool C is adapted to cooperate with, to an internal surface of discontinuity 17 of the same slice 2, opposed to the external surface 16, which generically represents a surface of discontinuity between the silicon slice 2 and an element made of different material which the slice 2 is attached to or is leant against and referred to, for example a portion of the machine tool.

According to the embodiment illustrated in FIG. 1, which comprises features known per se, the slice 2 of highly doped silicon is attached to a support layer 3 (generally plastic or glass) which has the function of providing a greater mechanical strength and therefore make the slice 2 more easy to handle, and the internal surface of discontinuity 17 is, for example, the surface of discontinuity between the silicon slice 2 and the support layer 3. A workpiece comprising the silicon slice 2 and the support layer 3 is placed on a support E, integral with the frame A, adapted to rotate in a predetermined direction opposite to the direction of rotation of the grinder C, transmitting the movement to the workpiece itself, placed at a fixed height.

The apparatus 1 comprises a radiation source 4, adapted to emit radiations, for instance a low coherence radiation beam, within a range of wavelengths in the near infrared region (since silicon is sufficiently transparent to infrared radiations), a spectrometer 5, adapted to analyse a spectrum of the result of interference between radiations reflected by surfaces of optical discontinuity that delimit one or more optically homogeneous layers, and a processing unit 10, connected to the spectrometer 5 in order to receive the spectrum analysed by the latter. The processing unit 10 is able to process the analysed spectrum through some known per se mathematical operations, and investigate given features of both the analysed spectrum and the processed spectrum, for instance determine whether said processed spectrum features one or more peaks or rather said analysed spectrum features one or more frequencies. From said given features, the processing unit 10 is also able to obtain information about which specific reflected radiations the analysed spectrum arises from, in other words information about receiving and detecting said specific reflected radiations by means of an optical probe 6. Depending on such information, the processing unit 10 is also able to perform a suitable checking of the thickness of the slice 2 on the basis of the one or more peaks featured by the processed spectrum. In particular, performing a processing according to the Fourier analysis as a function of frequency and knowing the refraction index of the silicon, the processing unit 10 is able to transform the analysed spectrum received from the spectrometer 5 and determine whether the transformed spectrum features one or more peaks or rather the analysed spectrum features one or more frequencies, in order to recognise, on the basis of the analysis of the spectrum, the radiations reflected by the surfaces of optical discontinuity which the analysed spectrum arises from, and, eventually, that said reflected radiations are received and detected by the optical probe 6. Depending on the reflected radiations it recognizes, the processing unit 10 is able to suitably process information about the thickness of the slice 2 on the basis of said one or more determined peaks of the transformed spectrum or rather one or more determined frequencies of the analysed spectrum, that is check such thickness.

The optical probe 6 is part of a detection system and, for example, is connected to the frame A of the machine tool and facing the slice 2 to be checked while being machined, typically in perpendicular position, as illustrated in figure, or slightly angled with respect to the outer external surface of the slice 2 itself, whence it is separated by means of air or liquid through which infrared radiations propagate. The optical probe 6 is supplied with a lens system 7 in order to focus the radiations on the slice 2 to be checked, as well as receive and detect the radiations reflected by surfaces of the same slice 2 and a result of possible interference between said reflected radiations. The optical probe 6, the radiation source 4 and the spectrometer 5 are connected, for example through optical fibre links, to an optical coupler 9.

Figure 2:
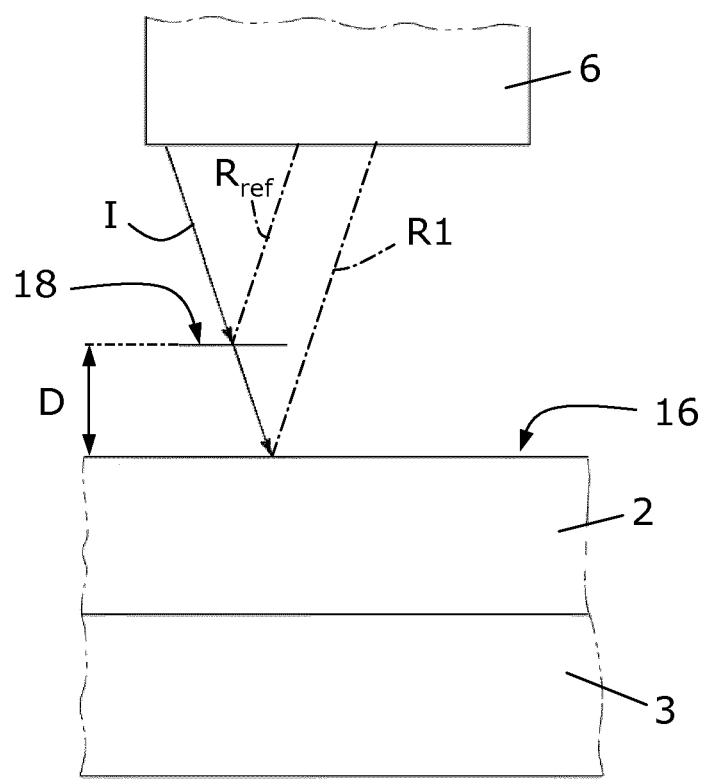
FIG. 2 is an enlarged schematic and lateral sectional view of the slice of semiconductor material of FIG. 1, which conceptually illustrates a checking phase according to the invention.

In addition, the apparatus 1 includes an optical reference, in particular an optical system with adjustable components and sections, known per se and outlined with the reference 8, placed between the radiation source 4 and the silicon slice 2. The optical system 8 defines a virtual reference surface 18 that determines in turn the suitable length of a reference optical path and, together with the external surface 16 of the silicon slice 2, delimits and defines a virtual thickness D related to the thickness of the slice 2. The schematic of FIG. 2 shows the virtual thickness D and the virtual reference surface 18, the latter being in a position, for example fixed, with respect to the detection system and the frame A of the machine tool and the optical probe 6, so that the length of the reference optical path does not change during the machining. Such position depends on the optical system 8 features.

In a method according to the known technique for optically checking by interferometry the thickness of an object being machined, in particular of the slice 2 while being rotated, the radiation source 4 emits a low coherence infrared radiation beam. Through the optical fibre links, such radiation beam reaches the optical coupler 9 and is transmitted by this to the optical probe 6 which, through the lens system 7, focuses it onto the silicon slice 2 to be checked during a machining phase, for instance during a grinding process, which entails a progressive surface removal of semiconductor material.

Figure 3:
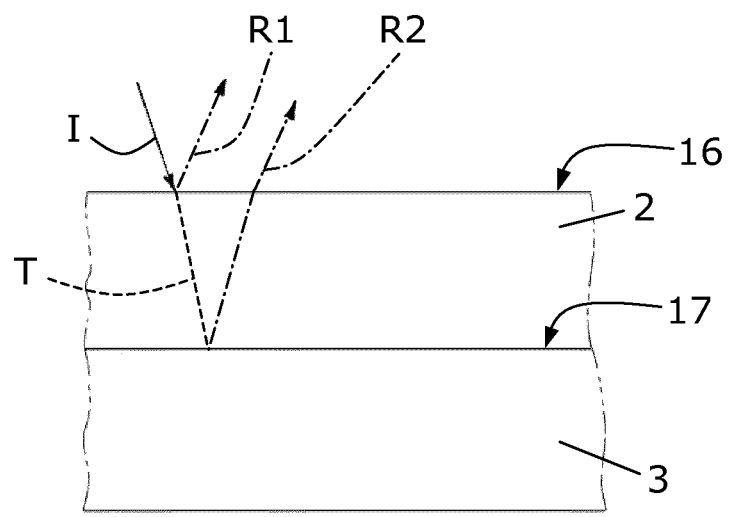
FIG. 3 is a schematic and lateral sectional view of the slice of semiconductor material during a known per se checking phase.

As it is shown in FIG. 3 and according to what is generally known, the optical probe 6 in use emits a beam of low coherence incident infrared radiations I. The incident radiations I impinge on the slice 2 and partially reflect (primary reflected radiation beam or primary reflected radiations R1) on the external surface 16 towards the optical probe 6, partially penetrate (refracted radiation beam or refracted radiations T) inside the silicon slice 2, undergoing an attenuation that is a function of the optical path inside the slice 2 itself, and reflect on the internal surface of discontinuity 17, coming out from slice 2 and propagating (secondary reflected radiation beam or secondary reflected radiations R2) towards the optical probe 6. The latter receives and detects said primary reflected radiations R1 and concurrent reflected radiations, more specifically the secondary reflected radiations R2, and a result of interference between said primary reflected radiations R1 and secondary reflected radiations R2, and transmits them to the spectrometer 5.

As previously mentioned, the incident radiation beam I is composed of low coherence radiations, that is radiations with different wavelengths. Among these radiations, a radiation the wavelength thereof is such that the optical path through the thickness of the slice 2 being machined is equal to a multiple integer of the wavelength itself, leaves the slice 2—after having been reflected on the internal surface of discontinuity 17—in phase with a radiation of the same wavelength reflected by the external surface 16. The sum of the radiations in phase determines a maximum of interference (constructive interference). On the contrary, a radiation featuring a wavelength such that the optical path through the thickness of the slice 2 being machined is equal to an odd multiple of the half-wavelength, leaves the slice 2—after having been reflected on the internal surface of discontinuity 17—in antiphase with a radiation of the same wavelength reflected by the external surface 16. The sum of the radiations in antiphase determines a minimum of interference (destructive interference).

Figure 5A:
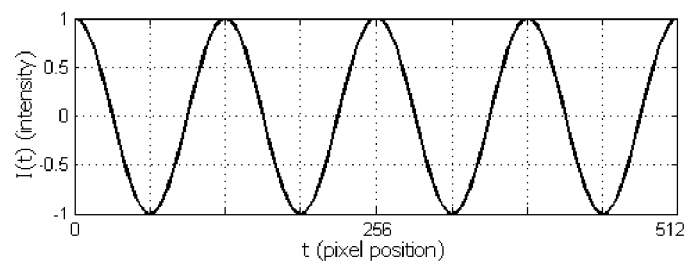
FIGS. 5a and 5b are two schematics which show, respectively, the spectrum of the result of interference between reflected radiations from two different surfaces of optical discontinuity, and the corresponding Fourier transform as a function of the optical path length.
Figure 5B:
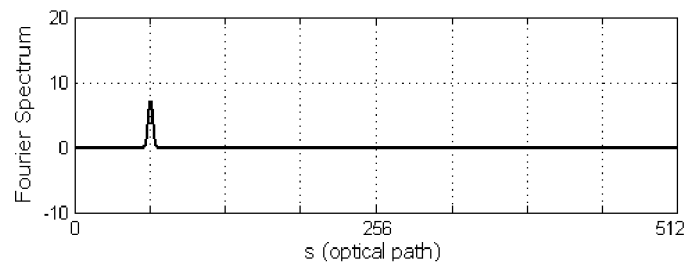

The spectrometer 5 analyses the spectrum of the result of interference between the primary reflected radiations R1 and the concurrent reflected radiations, more specifically the secondary reflected radiations R2, which is characterized by variable intensity determined by the alternation of constructive and destructive interferences, more specifically a sine wave the frequency thereof is proportional to the optical path length through the thickness of the silicon slice 2. The processing unit 10 receives the spectrum analysed by the spectrometer 5, and processes it by applying a Fourier transform. As it is known from the theory, the Fourier transform of the sine wave has a diagram that shows a peak at the optical path length proportional to the frequency of the sine wave itself. The diagrams of FIGS. 5a and 5b respectively show an example of the sine spectrum of the result of interference between the primary reflected radiations R1 and the secondary reflected radiations R2 and the same spectrum transformed according to the Fourier analysis and as a function of the optical path length. The processing unit 10 detects the optical path length which the peak is centered on, divides it by the refraction index of the silicon and processes information about the thickness of the slice 2, namely it directly checks such thickness.

Figure 4:
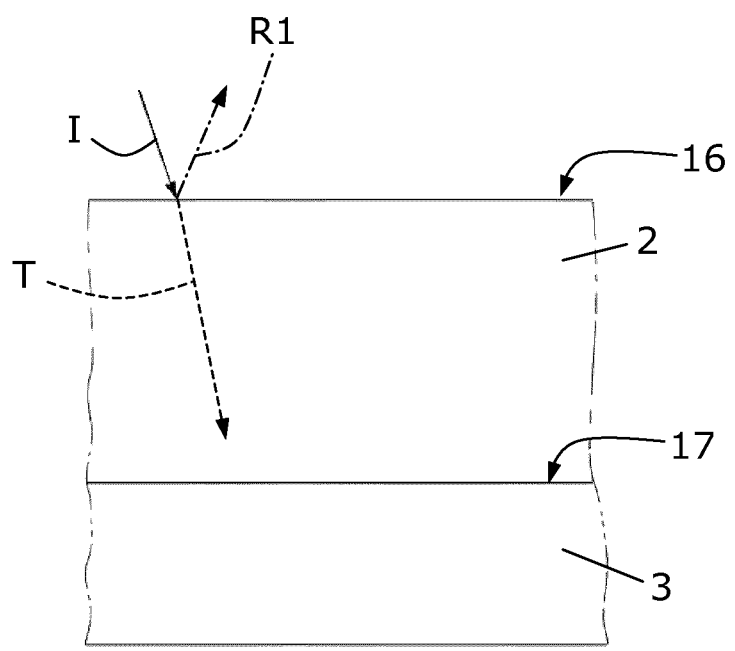
FIG. 4 is a schematic and lateral sectional view of the slice of semiconductor material, wherein the slice has a thickness greater than that of FIG. 3.

It is important to note that, for the sake of a better understanding, the incident radiations I, the refracted radiations T, the primary reflected radiations R1 and the secondary reflected radiations R2 are represented in FIGS. 3 and 4 by beams forming an angle different from 90° with respect to the silicon slice 2 but actually they can be perpendicular or substantially perpendicular to said slice 2.

However, there is a limit to the maximum thickness of the slice 2 being machined that the radiations, more specifically the refracted radiations T, are able to go through twice, the first time to travel from the external surface 16 to the internal surface of discontinuity 17, then to travel the opposite way as a consequence of the reflection on the internal surface of discontinuity 17. Such limit depends both on the entity of the thickness, which at the beginning of a grinding operation is considerably greater than that of the machined object, and on the kind and level of doping to which the slice 2 has been subjected. For example, a value of maximum measurable thickness for a highly doped silicon slice is equal to about 100 µm. FIG. 4 illustrates a situation that typically occurs at the start of the grinding process of a highly doped slice 2: the intensity of the refracted radiations T tends to zero inside the slice 2 and the optical probe 6 is not able to receive and/or detect any secondary reflected radiation R2. Consequently, the processing unit 10 is not able to perform the above described method according to the known technique for checking the thickness of the slice 2, that is it is not able to directly check the thickness. In accordance with the present invention, it is possible to work as follows to overcome this limitation.

When the thickness of the slice 2 being machined is greater than the maximum thickness that can be directly checked, for instance at the beginning of the grinding process, a method according to the present invention for checking the thickness of the slice 2 being rotated comprises a first preliminary phase wherein the machining of the slice 2, so a variation, in particular a dwindling, of the thickness thereof, is checked on the basis of the variations of the virtual thickness D. In particular, assuming the optical probe 6 and the external surface 16 of the silicon slice 2 placed at a distance such that the primary reflected radiations R1 generated by the reflection on the external surface 16 are received and detected by the optical probe 6, the spectrometer 5 analyses the sine spectrum of the result of interference between the primary reflected radiations R1 and concurrent reflected radiations, more specifically reference reflected radiations Rref emitted by the optical system 8 after having traveled the predetermined optical path, and received and detected by the detection system, simulating radiations reflected on the virtual reference surface 18 (FIG. 2). The processing unit 10 receives and transforms the spectrum of the result of interference analysed by the spectrometer 5, determines that the transformed spectrum features only one peak which is useful, or rather the analysed sine spectrum features only one frequency, from which it recognises, eventually, that no secondary reflected radiations R2 are received or detected by the optical probe 6. Then, the processing unit 10 processes information about the virtual thickness D, indicative of the thickness of the slice 2 being machined as a function of such transformed spectrum. More in detail, the processing unit 10 checks the virtual thickness D by processing the information about the optical path length which the virtual peak is centered on. In this phase, according to the preferred embodiment of the present invention, there is a variation, more specifically an increase of the virtual thickness D with the progress of the grinding process, corresponding to a dwindling of the thickness of the slice 2 being machined, hence a gradual movement of the virtual peak along the axis of the optical path length. The machining of the slice 2, so the dwindling thickness thereof, can then be checked on the basis of the variation of the virtual thickness D.

Figure 6A:
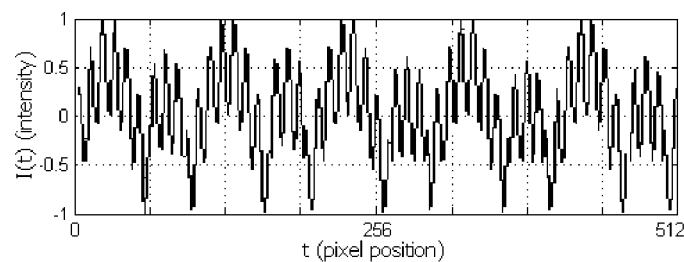
FIGS. 6a and 6b are two schematics which show, respectively, the spectrum of the result of interference between reflected radiations from three different surfaces of optical discontinuity, and the corresponding Fourier transform as a function of the optical path length.
Figure 6B:
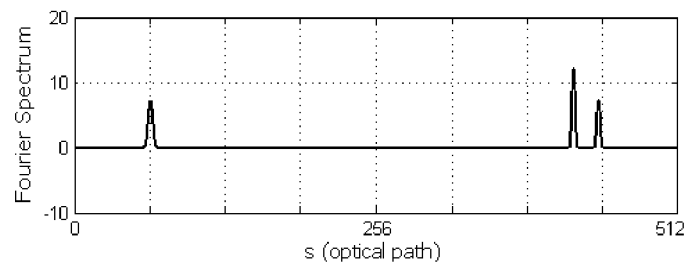

The grinding process goes on, for instance, in a substantially stable manner and the virtual thickness D, or the variation thereof, is checked, at least until a condition is verified wherein the thickness of the silicon slice 2 being machined is equal to the maximum thickness that can be directly checked with the known method, that is when also the secondary reflected radiations R2 generated by the reflection on the internal surface of discontinuity 17 are received and detected by the optical probe 6. This condition is verified by processing, on the basis of the analysis of the spectrum of the result of interference between the primary reflected radiations R1 and the concurrent reflected radiations, information about receiving and detecting the secondary reflected radiations R2 by means of said at least one optical probe 6. A method according to the present invention for checking the thickness of the slice 2 being rotated further comprises a phase of direct checking wherein the thickness of the slice 2 is directly checked. When also the secondary reflected radiations R2 are received and detected, the spectrum of the result of interference among the primary reflected radiations R1, the secondary reflected radiations R2 and the reference reflected radiations Rref is analysed by the spectrometer 5 and processed by the processing unit 10. Such spectrum is now characterized by the sum of three sine functions, one with variable frequency proportional to the optical path length through the dwindling thickness of the slice 2 (corresponding to the interference between the reflected radiations R1 and R2), another sine function also with variable frequency proportional to the optical path length through the growing virtual thickness D (corresponding to the interference between the reflected radiations R1 and Rref), the last with fixed frequency proportional to the optical path length with a total virtual thickness between the same virtual reference surface 18 and the internal surface of discontinuity 17, due to the constant sum of the virtual thickness D and the thickness of the slice 2 (corresponding to the interference between the reflected radiations Rref and R2). Consequently, the Fourier transform of this spectrum is characterized by three peaks, one for each of the three listed frequencies. The spectrum of this Fourier transform, processed as a function of optical path length by the processing unit 10, is still characterized by three peaks, now centered on the values of optical path corresponding to the three cited frequencies. During the grinding process, two peaks move along the axis of the optical path, the movements of such two peaks being consistent, and one peak holds steady. The diagrams of FIGS. 6a and 6b respectively show an example of the sine spectrum of the result of interference between the primary reflected radiations R1, the secondary reflected radiations R2 and the reference reflected radiations Rref, and the same spectrum transformed according to the Fourier analysis and as a function of optical path length. The processing unit 10 determines that the transformed spectrum features said three peaks and consequently recognises also the secondary reflected radiations R2, in addition to the primary reflected radiations R1 and the reference reflected radiations Rref, which the spectrum analysed by the spectrometer 5 in this phase arises from, or rather said analysed spectrum features three frequencies, from which it verifies, eventually, that also the secondary reflected radiations R2 are received and detected by the optical probe 6. The processing unit 10 detects the values of optical path the three peaks are centered on, divides them by the refraction index of the silicon, distinguishes the data related to the desired thickness, for instance on the basis of statistical evaluations, and processes information related to the thickness of the slice 2, namely it directly checks such thickness, for instance using a method according to the international patent application published under number WO2011/144624.

As soon as the peak appears at the optical path through the dwindling thickness of the slice 2 and the processing unit 10 verifies that the secondary reflected radiations R2 are received and detected by the optical probe 6, the phase of direct checking is started as a consequence and the preliminary phase wherein the virtual thickness D is checked can be terminated or otherwise kept operating with the aim of providing advantageous information for checking the machining of the slice 2 itself. Uses and additional advantages related to the check of the virtual thickness D are cited in the following, by way of example.

In the machining of a slice 2 including multiple layers of semiconductor material separated by at least one further internal surface of discontinuity inside the object 2, when these are directly checkable, a method for individually checking the different thicknesses does not allow to identify the disposition in which the layers are present within the slice 2. For example, the slice 2 includes a first layer 21 and a second layer 22 having thickness S21 and S22 respectively, as it is showed in FIGS. 7a and 8a. The optical probe 6 receives and detects, in addition to the primary reflected radiations R1, the secondary reflected radiations R2 and the reference reflected radiations Rref, intermediate reflected radiations Rint generated by a reflection on each further internal surface of discontinuity, in the example in figure by a reflection on the surface of discontinuity between the first layer 21 and the second layer 22, so the thickness S21 of the first layer 21 and the thickness S22 of the second layer 22 are directly checkable. The diagram of the corresponding spectrum as a function of the optical path shows two peaks, that allow to detect the presence and the thickness of as many layers inside the slice 2, but the two peaks do not provide any indication about their relative positions. As the grinding process progresses, which usually involves only one of the two layers, the peak relative to the rectified thickness undergoes a progressive movement along the axis of the optical path, while the peak relative to the thickness of the layer that is not machined keeps its position substantially unchanged.

The spectrum as a function of optical path, for example, is initially characterized by a peak X situated on the right of a peak Y (FIG. 7*b*); as the grinding process progresses, the same peak X moves to the left of the peak Y, the latter holding substantially steady on the other hand (FIG. 8*b*). The movement of the peak is indicative of the thickness variation of the rectified layer, but does not provide any information about the relative position of the first layer 21 and the second layer 22 inside the slice 2 being machined.

Figure 7A:
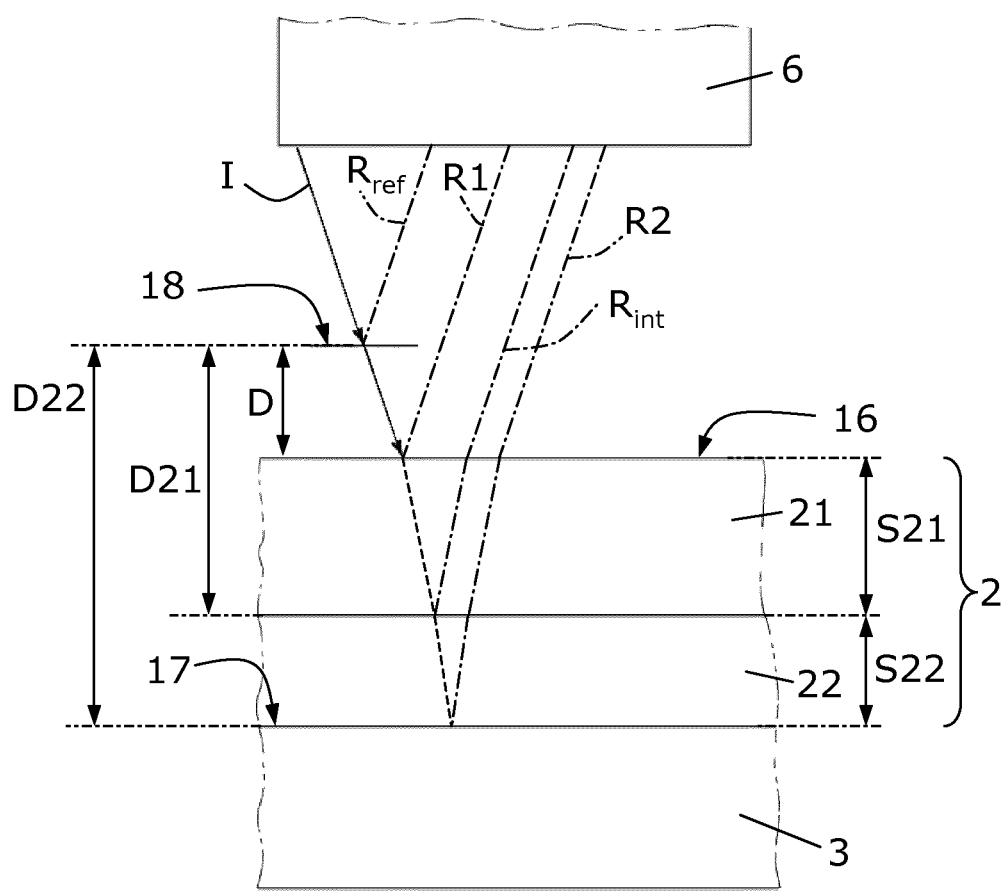
FIGS. 7a and 7b are, respectively, an enlarged schematic and lateral sectional view of a slice with two layers of semiconductor material, and the Fourier transform as a function of the optical path length of the spectrum of the result of interference between the radiations reflected by the surfaces of discontinuity of said slice, which conceptually illustrate a given instant of the check according to a particular embodiment of the invention.

The reference surface 18, in addition to delimiting and defining the virtual thickness D and the total virtual thickness between the virtual reference surface 18 itself and the internal surface of discontinuity 17, the total virtual thickness being referred to as D22 in FIGS. 7*a* and 8*a*, defines a length of a further optical path for the first layer 21, and delimits and defines, together with each further internal surface of discontinuity, in particular the surface of discontinuity between the first layer 21 and the second layer 22, a layer virtual thickness D21. Keeping on checking the virtual thicknesses through the optical system 8, the spectrum as a function of optical path comprises three additional peaks, relative to the virtual thickness D, the layer virtual thickness D21 and the total virtual thickness D22 respectively. Therefore the two virtual thicknesses D21 and D22 provide information about the layers 21 and 22 position with respect to the virtual reference surface 18, while the difference between the total virtual thickness D22 and the layer virtual thickness D21, D22−D21, is indicative of the relative position of the first layer 21 with respect to the second layer 22. As the grinding process progresses, as already described above in the preferred embodiment, a growth of the virtual thickness D is seen, as well as a progressive movement of the relative peak along the axis of the optical path. The position of the peaks relative to the virtual thicknesses between the virtual reference surface 18 and the surfaces of discontinuity, indeed, is substantially unchanged and, as a consequence, the difference D22−D21. For example, the spectrum as a function of optical path comprises the peaks M, N and O (FIG. 7*b*); as the grinding process progresses, the peak M moves towards the right, while the peaks N and O hold substantially steady (FIG. 8*b*). So it is possible to further check, in addition to the direct check although in a less accurate manner, the thickness variation of the layer being machined and, at the same time, the relative position of the first layer 21 and the second layer 22 inside the slice 2 being machined, for instance on the basis of the statistical evaluations of the method according to the already cited international patent application published under number WO2011/144624.

Figure 7B:
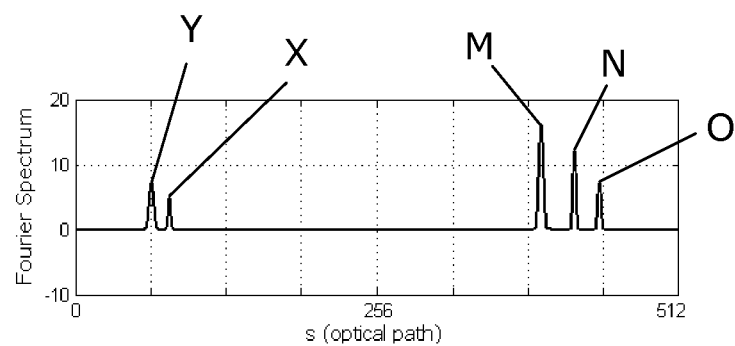

FIGS. 7*b* and 8*b* do not show a further peak, relative to the total thickness of the slice 2 being machined, given by the thickness S21 of the first layer 21 and the thickness S22 of the second layer 22, namely S21+S22, which, according to the theory, lies between peaks X and Y and peaks M, N and O, as in practice said further peak features an amplitude usually negligible with respect to that of the shown peaks and it can be omitted.

Preferably, while the virtual thickness D is checked, that is while the thickness of the slice 2 gradually dwindles and gets close to a directly checkable value, the grinding process can be progressively slowed down. In this manner, when the dwindling thickness of the slice 2 allows the direct check with the known method, the speed of advancement of the grinder C is sufficiently dwindled to ensure a reliable and accurate check, or to prevent the risk that the reaching of the desired thickness value is not correctly signaled and the machining can not be stopped in the nick of time.

Variations to the method and apparatus for checking as described hitherto can be made without departing from the scope of the invention.

According to a different embodiment of the apparatus 1 for checking, the optical coupler 9 can be replaced with a circulator or another device having the same function, that the optical fibre links, which the radiation source 4, the spectrometer 5 and the optical probe 6 are individually connected to, refer to.

The reference optical path can be realized in a different way with respect to the embodiment of FIG. 1, where it corresponds to the thickness D defined by the external surface 16 of the object 2 being machined and the reference surface 18, the latter being virtual and defined by the optical system 8. For instance, the reference optical path can be achieved through double reflection on an optical element located inside the optical probe itself and having an adjustable position, or it can be realized by means of a real reference surface 18 located between the optical probe 6 and the slice 2.

The position of the reference surface 18, virtual or real, that generates the reference reflected radiation Rref, with respect to the support E of the object being machined and, in the embodiment of FIG. 1, to the optical probe 6, can be known. In any case, a nominal distance between the reference surface 18 and the external surface 16 of the object 2 can be defined in a calibration phase that allows the processing unit 10 to detect the value of the initial distance between the optical probe 6 and the silicon slice 2 with high accuracy, and so to check with as much accuracy the thickness of the slice 2, or a variation thereof, during the machining.

Alternatively, the detection system comprises the optical probe 6, provided with a system for defining the reference surface 18 and designated for checking the virtual thickness D, and an additional optical probe designated for directly checking the thickness of the semiconductor material slice 2. In this alternative embodiment according to the present invention, the reference reflected radiations Rref are received and detected by means of the optical probe 6, and the secondary reflected radiations R2 are received and detected by means of the additional optical probe, the optical probe 6 being operative at least until the additional optical probe receives and detects the secondary reflected radiations R2, namely the slice 2 features the maximum thickness that can be directly checked.

In a different embodiment according to the present invention, the optical probe 6 is connected to the movement system of the machine tool and advances along the machining direction B in a way integral to the tool C. A method according to such different embodiment for checking the thickness of the object 2 being machined further comprises an advancement phase of the group tool C—optical probe 6 towards the object 2 and a later phase of actual machining of the object 2. During the advancement phase, for example, the preliminary phase occurs, as the thickness of the slice is greater than the maximum thickness that can be directly checked and the optical probe 6 receives both the primary reflected radiations R1 generated by the reflection on the external surface 16 and the reference reflected radiations Rref that are generated by the reflection on the reference surface 18, for instance the virtual surface defined by the optical system 8. The spectrometer 5 analyses the spectrum of the result of interference between these two reflected radiation beams. The processing unit 10 receives and transforms the spectrum analysed by the spectrometer 5, determines that the transformed spectrum features only one virtual peak or rather the analysed spectrum features only one frequency and consequently recognises the primary reflected radiations R1 and the reference reflected radiations Rref which the spectrum analysed by the spectrometer 5 arises from, in other words that no secondary reflected radiations R2 are received or detected by the optical probe 6, and processes information about the virtual thickness D as a function of such transformed spectrum. In particular, according to such different embodiment, the check in this advancement phase, which comes before the machining phase, is characterized by a progressive dwindling of the virtual thickness D as the tool B approaches the slice 2, and by an invariance of the thickness of the slice 2 itself. The virtual thickness D reaches its minimum value in the instant when the actual machining starts and the tool C begins to cooperate with the slice 2. The virtual thickness D holds fixed to its minimum value and contributes together with other information, for instance about the speed of advancement of the grinder C, to give an indication of the fact that the cooperation between the tool C and the slice 2 being machined persists, while the thickness of the latter progressively dwindles. When, during the machining, the thickness of the slice 2 is equal to or lower than the maximum thickness that can be directly checked with the optical probe 6, the latter receives the secondary reflected radiations R2, in addition to the primary reflected radiations R1 and the reference reflected radiations Rref, and, as a consequence, the phase of direct checking is started. The check of the thickness of the slice 2 being machined can then be performed in a direct manner according to the known technique. Also in this different embodiment, as in the preferred, the check of the virtual thickness D is performed at least until the thickness of the slice 2 being machined is equal to the maximum thickness that can be directly checked with the optical probe 6.

Generally, the object 2 to be checked can include, in addition to the layer affected by the machining, one or more layers of semiconductor material (as previously described), that is one or more layers of material that have a refraction index different from that of the semiconductor material which the object 2 is made of (like, for instance, the plastic or glass support layer 3, which the slice 2 is attached to or leant against and referred to) and a thickness that does not change throughout the course of the machining. In these cases, for each of said layers, the spectrum analysed by the spectrometer 5 comprises a sine component at a frequency constant over time. In a different embodiment according to the present invention, the processing unit 10 is able to select and process the peak on its own at the optical path length through the thickness of the object 2, even when further peaks at optical path length constant over time are present in the diagram of the transformed spectrum, for example using a method based on the statistical analysis of the analysed spectrum received from the spectrometer 5, according to the already cited international patent application published under number WO2011/144624. Even in this case, as soon as the thickness of the silicon slice 2 being machined is directly checkable, the phase of direct checking is started as a consequence and the preliminary phase for checking the virtual thickness D can be ended otherwise can be kept active with the aim, for example, of carrying on checking the reciprocal positions of the multiple layers the slice 2 is formed of.

The above described method and apparatus 1 for optically checking by interferometry the thickness of a slice 2 of semiconductor material being machined, and the related modifications, have numerous advantages in that they can be easily and cheaply implemented, and above all they allow to check in a suitable way all phases of the machining process, such as grinding, of a semiconductor material object having any thickness.

An expert of the art clearly sees, indeed, that the method and the apparatus according to the present invention for checking the thickness of an object 2 being machined can be advantageously used even in case the object 2 to be checked is realized in lowly doped or pure semiconductor material, the latter being characterized by an absorption of the light radiations lower than that of a highly doped semiconductor material, but features an initial thickness such that it is not transparent to light in any way and no secondary reflected radiations R2 can be received and detected by the optical probe 6. According to the present invention, this problem is overcome, in line with what previously described, by supporting the phase of direct checking the thickness of a slice 2 through the processing of the primary reflected radiations R1 and the secondary reflected radiations R2 generated by the reflection on two surfaces that delimit the slice 2 itself, with the preliminary phase for checking the virtual thickness D delimited by the external surface 16, which the tool is adapted to cooperate with, and the reference surface 18.

The invention claimed is:

1. A method for optically checking by interferometry the thickness of an object being machined by a machine tool, said thickness extending from an external surface, that cooperates with the machine tool, to an internal surface of discontinuity of the object; the method comprising the steps of:
   emitting low coherence incident radiations by means of a radiation source;
   focusing by means of at least one optical probe the incident radiations on the object being machined, said at least one optical probe being part of a detection system;
   receiving and detecting, by means of said detection system, primary reflected radiations generated by a reflection on the external surface of the object, and concurrent reflected radiations;
   analysing by means of a spectrometer a spectrum of the result of interference between said primary reflected radiations and concurrent reflected radiations; and
   processing on the basis of the analysis of the spectrum of the result of interference between the primary reflected radiations and the concurrent reflected radiations, information about the thickness of the object being machined;
   the method comprising a phase of direct checking wherein said concurrent reflected radiations are secondary reflected radiations generated by a reflection on the internal surface of discontinuity of the object; and
   wherein the method further comprises a preliminary phase wherein said concurrent reflected radiations are reference reflected radiations, generated by a reflection of said incident radiations on a reference surface, the reference surface being adapted to define the length of a reference optical path, and to delimit and define, together with said external surface of the object, a virtual thickness related to the thickness of the object;

wherein the step of processing information about the thickness of the object being machined includes checking variations of the virtual thickness; and wherein the direct-checking phase occurs subsequent to the preliminary phase, and wherein the thickness of the object during the preliminary phase is greater than the thickness of the object during the direct-checking phase.

2. The method according to claim 1, wherein said reference surface is virtual and defined by an optical system.

3. The method according to claim 1, for checking the thickness of an object being machined by a machine tool comprising a tool that cooperates with said external surface of the object and is movable with respect to said detection system along a machining direction, wherein the length of said reference optical path does not change during the machining.

4. The method according to claim 1, wherein said reference surface is in a fixed position with respect to the detection system.

5. The method according to claim 1, comprising the further step of checking, on the basis of the analysis of the spectrum of the result of interference between the primary reflected radiations and the concurrent reflected radiations, when the secondary reflected radiations are received and detected by said at least one optical probe.

6. A method for optically checking by interferometry the thickness of an object being machined by a machine tool, said thickness extending from an external surface, that cooperates with the machine tool, to an internal surface of discontinuity of the object; the method comprising the steps of:

emitting low coherence incident radiations by means of a radiation source;

focusing by means of at least one optical probe the incident radiations on the object being machined, said at least one optical probe being part of a detection system;

receiving and detecting, by means of said detection system, primary reflected radiations generated by a reflection on the external surface of the object, and concurrent reflected radiations;

analyzing by means of a spectrometer a spectrum of the result of interference between said primary reflected radiations and concurrent reflected radiations; and processing on the basis of the analysis of the spectrum of the result of interference between the primary reflected radiations and the concurrent reflected radiations, information about the thickness of the object being machined;

the method comprising a phase of direct checking wherein said concurrent reflected radiations are secondary reflected radiations generated by a reflection on the internal surface of discontinuity of the object; and wherein the method further comprises a preliminary phase wherein said concurrent reflected radiations are reference reflected radiations, generated by a reflection of said incident radiations on a reference surface, the reference surface being adapted to define the length of a reference optical path, and to delimit and define, together with said external surface of the object, a virtual thickness related to the thickness of the object;

wherein the method further comprises the step of checking, on the basis of the analysis of the spectrum of the result of interference between the primary reflected radiations and the concurrent reflected radiations, when the secondary reflected radiations are received and detected by said at least one optical probe; and wherein the phase of direct checking is started when the secondary reflected radiations are received and detected by said at least one optical probe.

7. The method according to claim 1, wherein, when the phase of direct checking is started, the preliminary phase is stopped.

8. The method according to claim 1, wherein the step of receiving and detecting the primary reflected radiations generated by the reflection on the external surface of the object, and the concurrent reflected radiations, comprises receiving and detecting the reference reflected radiations by means of said at least one optical probe, and receiving and detecting the secondary reflected radiations by means of an additional optical probe, the latter being part of the detection system.

9. The method according to claim 1, for checking the thickness of a slice of semiconductor material while the slice is rotating.

10. The method according to claim 1, for checking the thickness of a slice of highly doped silicon.

11. The method according to claim 1, for checking the thickness of an object comprising multiple layers of semiconductor material, said layers being separated by at least one further internal surface of discontinuity of the object, and the reference surface, together with each internal surface of discontinuity, delimiting and defining virtual thicknesses, the method being characterized by the following further steps:

receiving and detecting, by means of said at least one optical probe, intermediate reflected radiations generated by a reflection on said at least one further internal surface of discontinuity;

processing information about each of said virtual thicknesses on the basis of the spectrum of the result of interference between the reference reflected radiations and the intermediate and secondary reflected radiations;

processing information about the thickness and the relative location of said layers on the basis of said information about each of said virtual thicknesses.

12. An apparatus for optically checking by interferometry the thickness of an object being machined by a machine tool, said thickness extending from an external surface, that cooperates with the machine tool, to an internal surface of discontinuity of the object, the apparatus comprising:

a radiation source, adapted to emit low coherence incident radiations;

a detection system comprising at least one optical probe, connected to the radiation source and facing the object to be checked to focus the incident radiations emitted by the radiation source on the external surface and adapted to receive and detect primary reflected radiations and secondary reflected radiations respectively generated by a reflection on the external surface and by a reflection on the internal surface of discontinuity of the object;

a spectrometer, connected to said detection system, adapted to analyse a spectrum of the result of interference between said primary reflected radiations and secondary reflected radiations;

a processing unit, connected to said spectrometer, adapted to process, on the basis of the analysis of the spectrum of the result of interference between the primary reflected radiations and the secondary reflected radiations, information about the thickness of the object being machined;

an optical reference with a reference surface adapted to define the length of a reference optical path, and, together with said external surface of the object, to delimit and define a virtual thickness related to the thickness of the object;

the processing unit being adapted to process information about variations of the virtual thickness, indicative of variations of the thickness of the object being machined, when no secondary reflected radiations are received and detected by said at least one optical probe.

13. The apparatus according to claim 12, wherein said optical reference comprises an optical system and said reference surface is virtual.

14. The apparatus according to claim 12, wherein the reference surface is in a fixed position with respect to said detection system and the length of said reference optical path does not change during the machining.

15. The apparatus according to claim 12, wherein the processing unit is adapted to verify that the secondary reflected radiations are received and detected by means of said at least one optical probe.

* * * * *